(12) United States Patent
Seo et al.

(10) Patent No.: US 9,947,835 B2
(45) Date of Patent: Apr. 17, 2018

(54) LIGHT-EMITTING ELEMENT AND LIGHT-EMITTING PACKAGE COMPRISING SAME

(71) Applicant: LG INNOTEK CO., LTD., Seoul (KR)

(72) Inventors: Jae Won Seo, Seoul (KR); Seok Beom Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/319,633

(22) PCT Filed: Jun. 15, 2015

(86) PCT No.: PCT/KR2015/005984
§ 371 (c)(1),
(2) Date: Dec. 16, 2016

(87) PCT Pub. No.: WO2015/194804
PCT Pub. Date: Dec. 23, 2015

(65) Prior Publication Data
US 2017/0236979 A1 Aug. 17, 2017

(30) Foreign Application Priority Data
Jun. 16, 2014 (KR) .......................... 10-2014-0072659

(51) Int. Cl.
*H01L 29/18* (2006.01)
*H01L 33/46* (2010.01)
(Continued)

(52) U.S. Cl.
CPC ............ *H01L 33/46* (2013.01); *H01L 27/153* (2013.01); *H01L 33/06* (2013.01); *H01L 33/30* (2013.01);
(Continued)

(58) Field of Classification Search
CPC ......... H01L 33/06; H01L 33/30; H01L 33/32; H01L 33/42; H01L 33/46; H01L 33/62;
(Continued)

(56) References Cited

U.S. PATENT DOCUMENTS 7,138,286 B2   11/2006   Manabe et al.
9,412,922 B2 *  8/2016   Jang ....................... H01L 27/156
(Continued)

FOREIGN PATENT DOCUMENTS

DE   10 2012 108879 A   3/2014
JP      2002-118294      4/2002
(Continued)

OTHER PUBLICATIONS

International Search Report (with English Translation) and Written Opinion dated Aug. 27, 2015 issued in Application No. PCT/KR2015/005984.
(Continued)

*Primary Examiner* — Yosef Gebreyesus
(74) *Attorney, Agent, or Firm* — KED & Associates, LLP

(57) ABSTRACT

A light emitting device includes a substrate; a plurality of light emitting cells disposed on the substrate to be spaced apart from one another, the light emitting cell having a via hole passing through the second conductive type semiconductor layer, the active layer and a part of the first conductive type semiconductor layer; a first electrode layer electrically connected to the first conductive type semiconductor layer at a bottom of the via hole; a second electrode layer disposed on the second conductive type semiconductor layer; and a first passivation layer, electrically separating the first electrode layer from the second electrode layer, wherein the first electrode layer of one light emitting cell is electrically connected to the second electrode layer of another light emitting cell adjacent to the one light emitting cell.

16 Claims, 12 Drawing Sheets

(51) Int. Cl.
  *H01L 27/15* (2006.01)
  *H01L 33/06* (2010.01)
  *H01L 33/32* (2010.01)
  *H01L 33/30* (2010.01)
  *H01L 33/40* (2010.01)
  *H01L 33/42* (2010.01)
  *H01L 33/62* (2010.01)
  *F21V 8/00* (2006.01)
  *F21K 9/232* (2016.01)
  *F21Y 115/10* (2016.01)

(52) U.S. Cl.
  CPC ............ *H01L 33/32* (2013.01); *H01L 33/405* (2013.01); *H01L 33/42* (2013.01); *H01L 33/62* (2013.01); *F21K 9/232* (2016.08); *F21Y 2115/10* (2016.08); *G02B 6/0073* (2013.01)

(58) Field of Classification Search
  CPC .. H01L 33/405; H01L 27/153; F21Y 2115/10; G02B 6/0073; F21K 9/232
  See application file for complete search history.

(56) References Cited

U.S. PATENT DOCUMENTS

| 2004/0080266 | A1* | 4/2004 | Park | H01L 27/3244 313/509 |
| 2012/0074441 | A1* | 3/2012 | Seo | H01L 27/153 257/91 |
| 2014/0070245 | A1 | 3/2014 | Haberern et al. | |
| 2014/0159071 | A1 | 6/2014 | Choi et al. | |
| 2014/0191194 | A1 | 7/2014 | Hwang et al. | |
| 2015/0280086 | A1* | 10/2015 | Jang | H01L 27/156 257/88 |

FOREIGN PATENT DOCUMENTS

| KR | 10-0696194 | 3/2007 |
| KR | 10-2014-0044059 | 4/2014 |
| WO | WO 2014/038794 | 3/2014 |

OTHER PUBLICATIONS

European Search Report dated Oct. 5, 2017 issued in Application No. 15810403.4-1551.

* cited by examiner

US 9,947,835 B2

LIGHT-EMITTING ELEMENT AND LIGHT-EMITTING PACKAGE COMPRISING SAME

CROSS-REFERENCE TO RELATED PATENT APPLICATIONS

This application is a U.S. National Stage Application under 35 U.S.C. § 371of PCT Application No. PCT/KR2015/005984, filed Jun. 15, 2015, which claims priority to Korean Patent Application No. 10-2014-0072659, filed Jun. 16, 2014, whose entire disclosures are hereby incorporated by reference.

TECHNICAL FIELD

Embodiments relate to a light emitting device and a light emitting device package including the same.

BACKGROUND ART

Light emitting devices, such as light emitting diodes or laser diodes, which use group III-V or II-VI compound semiconductors, are capable of emitting visible and ultraviolet light of various colors such as red, green, and blue owing to development of device materials and thin film growth techniques. These light emitting devices are also capable of emitting white light with high luminous efficacy through use of a fluorescent substance or color combination and have several advantages of low power consumption, semi-permanent lifespan, fast response speed, safety, and environmental friendliness as compared to conventional light sources such as, for example, fluorescent lamps and incandescent lamps.

Accordingly, fields of application sectors of the light emitting devices are expanded up to transmission modules of optical communication means, light emitting diode backlights to replace cold cathode fluorescence Lamps (CCFLs) which serve as backlights of liquid crystal display (LCD) apparatuses, white light emitting diode lighting apparatus to replace fluorescent lamps or incandescent lamps, vehicular headlamps, and traffic lights. Recently, a high-voltage light emitting device to which a plurality of light emitting cells is applied is implemented owing to expansion of the fields of application.

FIG. 1 is a view illustrating a structure of a conventional horizontal high-voltage light emitting device.

According to the conventional light emitting device in FIG. 1, a plurality of light emitting cells 20 may be disposed on a substrate 10. Each light emitting cell 20 includes a first conductive type semiconductor layer 21, an active layer 22, and a second conductive type semiconductor layer 23. A first electrode layer 30 electrically connected to the first conductive type semiconductor layer 21, a second electrode layer 40 disposed on the second conductive type semiconductor layer 23, and a passivation layer 50 protecting the light emitting cells 20 while electrically separating the first electrode layer 30 from the second electrode layer 40 are provided. However, in the case of the conventional horizontal light emitting device for the high voltage as illustrated in FIG. 1, a sapphire (Al2O3) substrate having a thickness of about 100 μm is used such that it is not easy to radiate heat generated when emitting light. Thereby, characteristics of the device are deteriorated.

A flip-chip type light emitting device is used as one of the methods for solving the problem of heat radiation. In the case of the flip-chip type light emitting device, a reflective layer is disposed on the second electrode layer in the structure of the light emitting cell to change a photon path, thereby improving luminance efficiency. However, the emitted light totally reflected by the substrate is absorbed into the light emitting cell, or light extraction is not performed at a space between the light cells such that the amount of light emission extracted upwards is smaller than the amount of light emission generated at the active layer, thereby lowering luminance efficiency. FIG. 2 is a view showing phenomenon of radiation of the flip-chip type light emitting device.

DISCLOSURE

Technical Problem

Embodiments provide a light emitting device improving luminance efficiency.

Technical Solution

In one embodiment, a light emitting device includes a substrate, a plurality of light emitting cells disposed on the substrate to be spaced apart from one another, each light emitting cell comprising a first conductive type semiconductor layer, an active layer, and a second conductive type semiconductor layer, the light emitting cell having a via hole passing through the second conductive type semiconductor layer, the active layer and a part of the first conductive type semiconductor layer, a first electrode layer electrically connected to the first conductive type semiconductor layer at a bottom of the via hole, a second electrode layer disposed on the second conductive type semiconductor layer, and a first passivation layer electrically separating the first electrode layer from the second electrode layer, wherein the first electrode layer of one light emitting cell is electrically connected to the second electrode layer of another light emitting cell adjacent to the one light emitting cell.

The first passivation layer may be disposed between the second electrode layer, a sidewall of the via hole, and a sidewall of the light emitting cell.

The first passivation layer may be further disposed at the substrate between adjacent light emitting cells.

The light emitting device may further include a second passivation layer disposed on the first electrode layers.

The second passivation layer may be disposed at entire regions of surfaces of the light emitting cells, and the second passivation layer may include opened regions which expose at least one of the first electrode layers and the second electrode layers.

The second passivation layer may include at least one of Si, N, Ti and O.

Each of the first electrode layers may be an ohmic electrode including at least one of Al and Ag.

The first passivation layer may have a reflective layer structure, in which a plurality of layers is stacked.

The reflective layer structure including the stacked layers may include a distributed Bragg reflector.

Each of the second electrode layers may include a transparent electrode layer and a reflective layer.

In another embodiment, a light emitting device includes a substrate, a plurality of light emitting cells disposed on the substrate to be spaced apart from one another, each light emitting cell including a first conductive type semiconductor layer, an active layer, and a second conductive type semiconductor layer, the light emitting cell having a via hole passing through the second conductive type semiconductor layer, the active layer and a part of the first conductive type semiconductor layer, a first electrode layer electrically connected to the first conductive type semiconductor layer at a bottom of the via hole, a second electrode layer disposed on the second conductive type semiconductor layer, and a first passivation layer electrically separating the first electrode layers from the second electrode layers, wherein at least one or more via holes is formed in one light emitting cell, the first electrode layer connected to the via hole is electrically connected to the first electrode layer of another via hole adjacent to the via hole in the one light emitting cell, and the second electrode layer of another light emitting cell adjacent to the one light emitting cell.

The first passivation layer may be disposed between the second electrode layer, a sidewall of the via hole, and a sidewall of the light emitting cell.

The first passivation layer may be further disposed at the substrate between adjacent light emitting cells.

The light emitting device may further include a second passivation layer disposed above the first electrode layer.

The second passivation layer may be disposed at entire regions of surfaces of the light emitting cells, and the second passivation layer may include opened regions which expose at least one of the first electrode layers and the second electrode layers.

The second passivation layer may include at least one of Si, N, Ti and O.

Each of the first electrode layers may be an ohmic electrode including at least one of Al and Ag.

The first passivation layer may have a reflective layer structure, in which a plurality of layers is stacked.

Each of the second electrode layers may include a transparent electrode layer and a reflective layer.

In the other embodiment, a light emitting device package includes a submount, a light emitting device of any one of the embodiment, and a pair of metallic bumps disposed between the submount and the light emitting device, the metallic bumps bonding first electrode layers and second electrode layers of the light emitting device to the submount in a flip chip manner.

Advantageous Effects

In the light emitting light device according to the illustrated embodiment, the first passivation layer and the first electrode layer which are stacked are disposed at the substrate which is the space between the light emitting cells, such that light extraction due to reflection of light may be performed at the light emitting cells and the substrate where the light emitting cells are not disposed, thereby improving luminance efficiency.

BEST MODE

Figure 1:
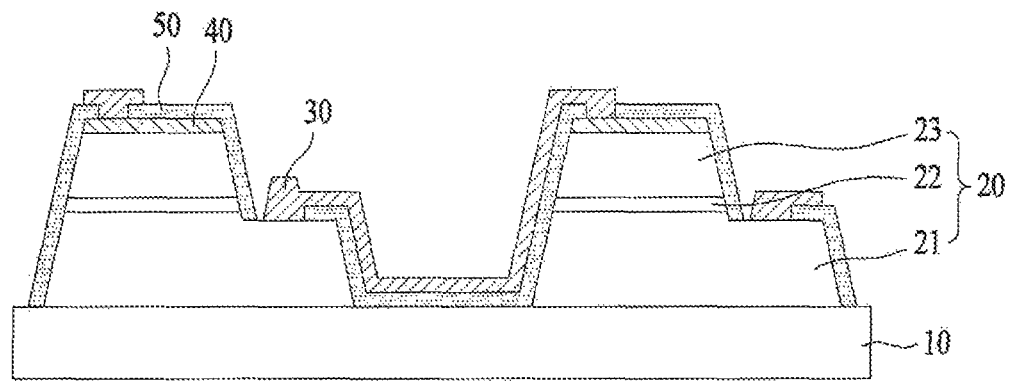
FIG. 1 is a view illustrating a conventional horizontal high-voltage light emitting device.
Figure 2:
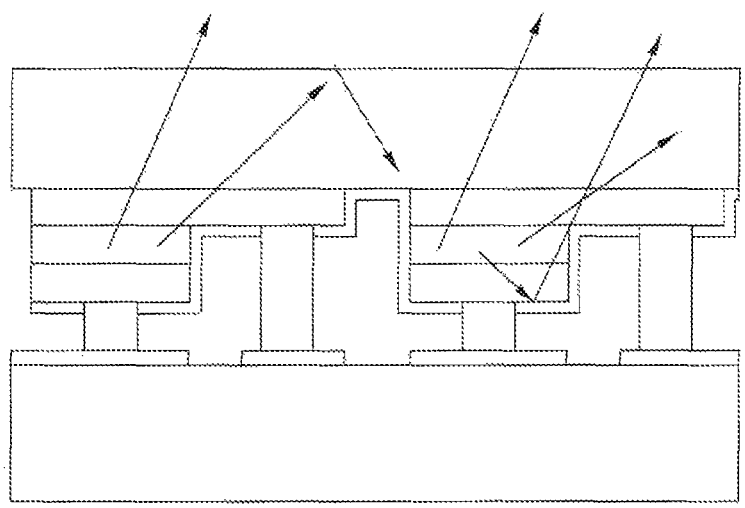
FIG. 2 is a view showing phenomenon of radiation of the conventional flip-chip type light emitting device.

Hereinafter, embodiments will be clearly understood from the annexed drawings and the description associated with the embodiments.

It should be understood that when an element is referred to as being "on" or "under" another element, it may be directly on/under the element, and/or one or more intervening elements may also be present. When an element is referred to as being "on" or "under", "under the element" as well as "on the element" may be included based on the element.

In the drawings, the sizes of elements may be exaggerated, omitted or schematically illustrated for convenience in description and clarify. Further, the sizes of elements do not mean the actual sizes of the elements.

Figure 3A:
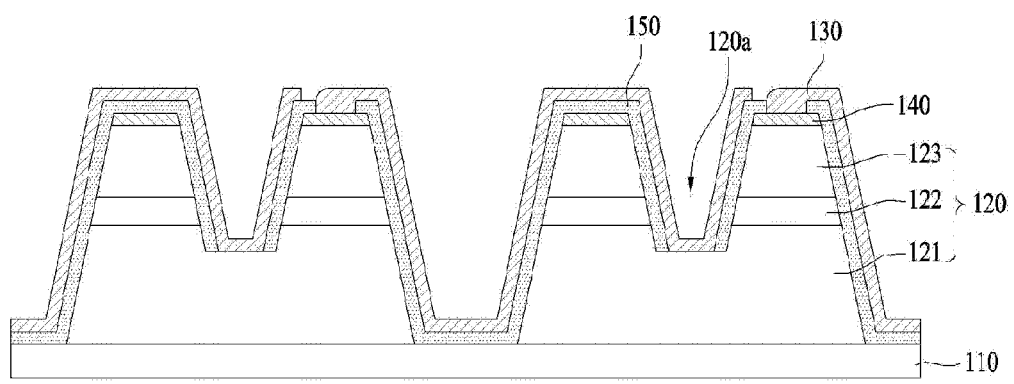
FIGS. 3A and 3B are a cross-sectional view and a plan view illustrating a light emitting device according to an embodiment.
Figure 3B:
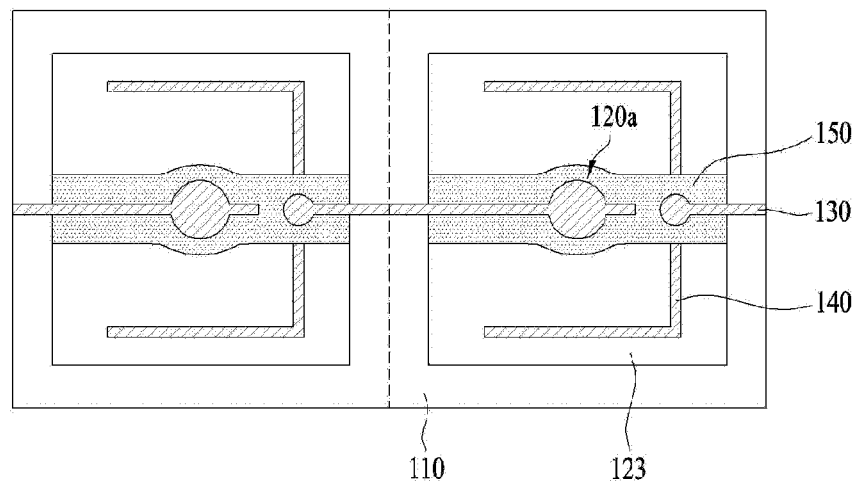

FIGS. 3A and 3B are a cross-sectional view and a plan view of a light emitting device according to an embodiment.

The light emitting device according to the embodiment may include a substrate 110, a plurality of light emitting cells 120, a first electrode layer 130, a second electrode layer 140, and a first passivation layer 150.

In the light emitting device according to the embodiment, the substrate 110 may be formed of a material which is suitable for semiconductor material growth, is capable of being formed as a carrier wafer, and has high heat conductivity. The substrate 110 may include a conductive substrate or an insulation substrate. For example, the substrate 110 may use at least one of sapphire ($Al_2O_3$), SiC, Si, GaAs, GaN, ZnO, Si, GaP, InP, Ge, and $Ga_2O_3$. Furthermore, the substrate 110 may use a patterned sapphire substrate where a convex-concave surface is processed in order to improve light extraction efficiency.

In the embodiment, a plurality of light cells 120 is arranged on the substrate 110 to be spaced apart from one another. The quantity of the light emitting cells 120 is at least two. When the quantity of the light emitting cells 120 is greater than two, the light emitting cells 120 may be arranged in rows and columns. Each light emitting cell 120 may include a first conductive type semiconductor layer 121, an active layer 122, and a second conductive type semiconductor layer 123.

The first conductive type semiconductor layer 121 may be formed of a semiconductor compound. The first conductive type semiconductor layer 121 may be formed of group III-V or II-VI compound semiconductors, and may be doped by first conductive type dopants. When the first conductive type semiconductor layer 121 may be an n-type semiconductor layer, the first conductive type dopants may be n-type dopants and may include Si, Ge, Sn, Se and Te, without being limited thereto. The first conductive type semiconductor layer 121 may include a semiconductor material having a composition of $In_xAl_yGa_{1-x-y}N$ ($0 \le x \le 1$, $0 \le y \le 1$, $0 \leq x+y \leq 1$). The first conductive type semiconductor layer 121 may be formed of any one or more materials selected from among GaN, InN, AlN, InGaN, AlGaN, InAlGaN, AlInN, AlGaAs, InGaAs, AlInGaAs, GaP, AlGaP, InGaP, AlInGaP and InP.

In the active layer 122, electrons injected through the first conductive type semiconductor layer 121 are paired with holes injected through the second conductive type semiconductor layer 123 to emit light having energy which is determined by an inherent energy band of a material forming the active layer 122. The active layer 122 may have any one of a double hetero structure, a multi-well structure, a single quantum well structure, a multi quantum well structure, a quantum wire structure, or a quantum dot structure. For example, the active layer 122 may be formed to have the multi-well structure where a trimethylgallium (TMGa) gas, an ammonia gas (NH3), a nitrogen gas (N2), and a trimethylindium gas (TMIn) are injected, without being limited thereto.

Well layer/blocking layer of the active layer may be formed of, for example, any one or more material selected from among InGaN/GaN, InGaN/InGaN, GaN/AlGaN, InAlGaN/GaN, InAlGaN/InAlGaN, GaAs(InGaAs)/AlGaAs, and GaP(InGaP)/AlGaP to have a pair structure, without being limited thereto. The well layer may be formed of a material having a lower band gap than a band gap of the blocking layer.

A conductive clad layer (not shown) may be formed on and/or under the active layer 122. The conductive clad layer may be formed of a semiconductor having a wider band gap than band gaps of the well and blocking layers of the active layer 122. For example, the conductive clad layer may include GaN, AlGaN, InAlGaN, or a superlattice structure. Furthermore, the conductive clad layer may be doped by n type dopants or p type dopants.

The second conductive type semiconductor layer 123 is formed on the active layer 122. The second conductive type semiconductor layer 123 may be formed of a semiconductor compound. The second conductive type semiconductor layer 123 may be formed of group III-V or II-VI compound semiconductors, and may be doped by second conductive type dopants. For example, the second conductive type semiconductor layer 123 may include a semiconductor material having a composition of InxAlyGa1−x−yN ($0 \leq x \leq 1$, $0 \leq y \leq 1$, $0 \leq x+y \leq 1$). When the second conductive type semiconductor layer 123 may be a p-type semiconductor layer, the second conductive type dopants may be p-type dopants and may include Mg, Zn, Ca, Sr, and Ba.

The light emitting cell 120 including the first conductive type semiconductor layer 121, the active layer 122, and the second conductive type semiconductor layer 123 may have a via hole 120a, in which a part of an upper part of the light cell 120 is etched, or more specifically, is etched from a surface of the second conductive type semiconductor layer 123 so as to pass through the active layer 122 while exposing a part of the first conductive type semiconductor layer 121.

In the light emitting cell 120, instead of a via hole structure, the parts of the second conductive type semiconductor layer 123 and the active layer 122 of the upper part of the light emitting cell 120 may be etched by a mesa etching process to expose the part of the first conductive type semiconductor layer 121.

In the light emitting device according to the embodiment illustrated in FIGS. 3A and 3B, the first electrode layer 130 may be disposed to be electrically connected to the first conductive type semiconductor layer 121 at a bottom surface of the via hole 120a formed in the light emitting cell 120.

The second electrode layer 140 may be disposed on the second conductive type semiconductor layer 123. The first passivation layer 150 may be disposed between the first electrode layer 130 and the second electrode layer 140 to be electrically isolated therefrom. The first electrode layer 130 in one light emitting cell may be formed to be connected to the second electrode layer 140 of another light emitting cell adjacent to the one light emitting cell.

The first electrode layer 130 may be disposed on the first passivation layer 150 to be in contact with the exposed first conductive type semiconductor layer 121 where the first passivation layer 150 is not formed at the bottom surface of the via hole 120a. The first electrode layer 140 may be disposed to be in contact with the exposed second electrode layer 140 where the first passivation layer 150 is not formed on the second electrode layer 140. Herein, in order to prevent the first electrode layer 130 and the second electrode layer 140 from being electrically connected to each other in one light emitting cell, a part of the first electrode layer 130 may be etched at the upper part of the second electrode layer 140 or a peripheral region such that the first passivation layer 150 may be exposed.

The first electrode layer 130 may be an n-type ohmic electrode layer. The first electrode layer 130 may include Al (aluminum) or Ag (silver), more particularly, Al/Cr (chrome)/Al, Ti(titanium)/Al, Ag or Ni(nickel)/Ag, to function as a reflective layer.

The second electrode layer 140 may be formed on the second conductive type semiconductor layer 123.

The second electrode layer 140 may selectively use a transparent conductive material and a metallic material. For example, the second electrode layer 140 may be formed of at least one indium tin oxide (ITO), indium zinc oxide (IZO), indium zinc tin oxide (IZTO), indium aluminum zinc oxide (IZTO), indium gallium zinc oxide (IGZO), indium gallium tin oxide (IGTO), aluminum zinc oxide (AZO), antimony tin oxide (ATO), a gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, or Ni/IrOx/Au/ITO, Ag, Ni, Cr, Ti, Al, Rh, Pd, Ir, Sn, In, Ru, Mg, Zn, Pt, Au, or Hf.

Furthermore, the second electrode layer 140 may include a p-type ohmic electrode layer and a reflective layer. The p-type ohmic electrode layer may include indium tin oxide (ITO), ZnO, InO, SnO or an alloy thereof and the reflective layer may include Ag or Al, without being limited thereto.

The first passivation layer 150 may function to protect the light emitting cell 120. The first passivation layer 150 may be formed to electrically separate the first electrode layer 130 from the second electrode layer 140, at between adjacent light emitting cells 120 or in one light emitting cell 120.

The first passivation layer 150 is disposed at the second electrode layer 140, a sidewall of the via hole 120a, and a sidewall of each light emitting cell 120. For electrical connection of different light emitting cells, the first passivation layer 150 may not be formed at the first conductive type semiconductor layer 121 (i.e. the bottom of the via hole 120a) exposed by the via hole 120a formed in one light emitting cell, and a part of the second electrode layer 140 of another light emitting cell adjacent to the one light emitting cell.

The first passivation layer 150 may be disposed on the substrate 110 between adjacent light emitting cells 120. Furthermore, the first electrode layer 130 may be disposed on the entire upper surface of the formed first passivation layer 150. The first electrode layer 130 may electrically connect two adjacent light emitting cells 120 to each other.

The formed first electrode layer 130 may continuously connect the first electrode layer 130 of one light emitting cell 120 of two adjacent light emitting cells 120 and the second electrode layer 140 of the other light emitting cell 120 such that a plurality of light emitting cells 120 may be electrically connected to each other in series. Alternatively, an electrode of one light emitting cell 120 of two adjacent light emitting cells 120 may be connected to an electrode of the other light emitting cell 120 having the same polarity as the electrode of the one light emitting cell 120 (130 is connected to 130 or 140 is connected to 140) such that a plurality of light emitting cell 120 may be connected to each other in parallel.

The first passivation layer 150 may include an inorganic layer, a non-conductive oxide or a nitride. The first passivation layer 150 may be formed of any one including Si, N, Ti, and O such as SiN, SiO2, or TiO2.

In FIG. 3B, adjacent light emitting cells 120 are disposed on the substrate 110. FIG. 3B has a dotted line to divide the adjacent light emitting cells 120. The first electrode layer 130 may be electrically connected to the first conductive type semiconductor layer (not shown in the plan view) in the via hole 120a and may be in electrical contact with the second electrode layer 140 of the adjacent light emitting cell 120. The second electrode layer 140 may be electrically connected to the second conductive type semiconductor layer 123.

In one light emitting cell, the first electrode layer 130, which is in electrical contact with the first conductive type semiconductor layer 121, and the second electrode layer 140, which is in electrical contact with the second conductive type semiconductor layer 123, may be electrically isolated by the first passivation layer 150. The first passivation layer 150 may be disposed at a region between adjacent light emitting cells 120.

Figure 4A:
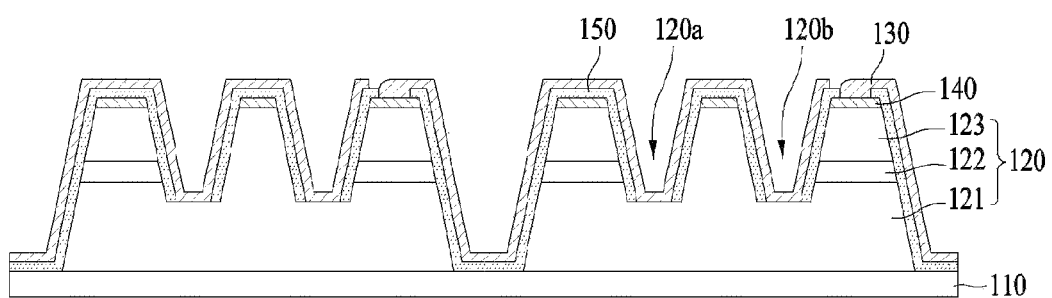
FIGS. 4A and 4B are a cross-sectional view and a plane view illustrating a light emitting device according to another embodiment.
Figure 4B:
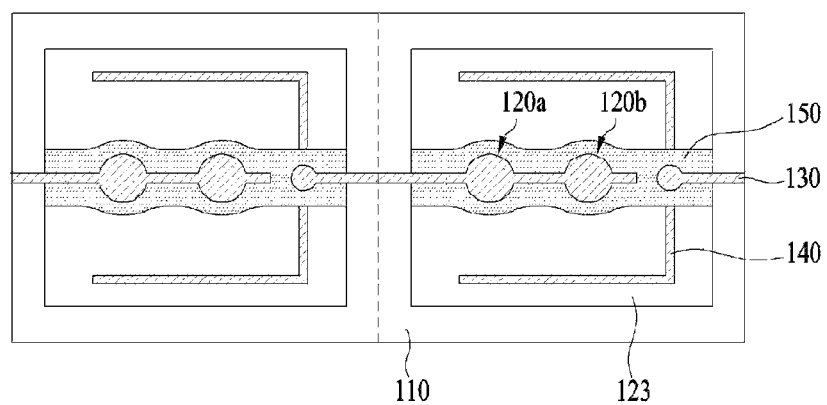

FIGS. 4A and 4B are a cross-sectional view and a plane view illustrating a light emitting device according to another embodiment.

The light emitting device according to another embodiment may include a substrate 110, a plurality of light emitting cells 120, a first electrode layer 130, a second electrode layer 140, and a first passivation layer 150.

In another embodiment, at least one via holes 120a and 120b may be formed at each light emitting cell 120 and the first electrode layer 130 connected to the via hole 120b may be electrically connected to the first electrode layer of the via hole 120a adjacent to the via hole 120b. In addition, the first electrode layer 130 may be electrically connected to the second electrode layer 140 of the light emitting cell 120 adjacent to the light emitting cell 120 in which the via hole 120a is formed.

Each of the via holes 120a and 120b illustrated in FIGS. 3A and 3B may be formed to have a circular cone which has a wide upper part and a narrow lower part. The via holes 120a and 120b may be arranged in rows in one direction of the light emitting device. The via holes 120a and 120b may be arranged in rows and columns. However, shapes of arrangement of the via holes 120a and 120b are not limited thereto.

As described above, when a plurality of via holes 120a and 120b are formed in one light emitting cell 120, uniform luminance quality may be provided within one light emitting cell 120.

Figure 5:
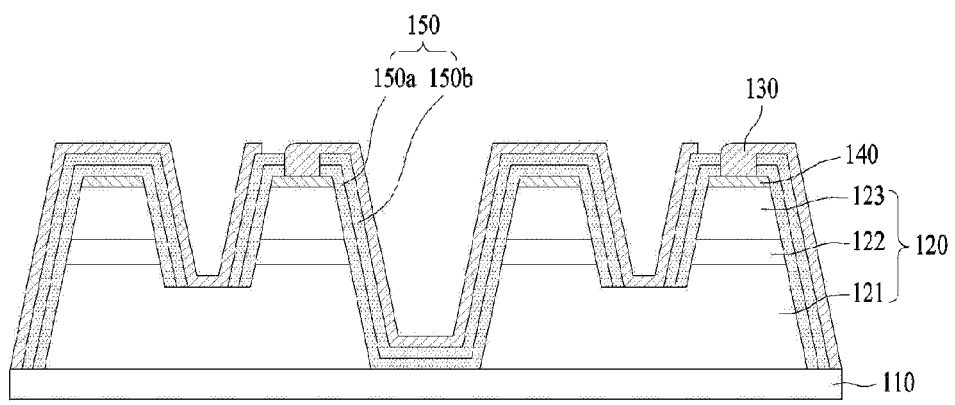
FIG. 5 is a view illustrating a light emitting device including a passivation layer having multiple layers.

As illustrated in FIG. 5, the first passivation layer 150 may include at least two layers 150a and 150b, which are different. In the case where more than two layers are present, a first layer 150a and a second layer 150b may be alternatively disposed two or more times. The first layer 150a and the second layer 150b may be reflective layers including materials having different refractive indices. The refractive index of the first layer 150a may be greater than the refractive index of the second layer 150b. The first passivation layer 150 may have a distributed Bragg reflector (DBR), in which a plurality of layers including the first layer 150a and the second layer 150b are stacked. The first layer 150a of the reflective layers may include at least one of Si, TiO2, and SiNx. The second layer 150b having a smaller refractive index than that of the first layer 150a may include at least one of Al2O3, SiO2, and SiNx.

When light generated from the active layer 122 is entirely reflected to proceed into the light emitting cell 120, light may not be absorbed into the light emitting cell 120 but may be extracted outside due to difference in the refractive indices of the stacked structure constituting the first passivation layer 150. Furthermore, light emitted from a side of the light emitting cell 120 may be refracted at an interface between the first layer 150a and the 150b which have different refractive indices, such that a region capable of emitting light outside the light emitting cell 120 may be widened.

In the light emitting device according to the embodiment illustrated, the first passivation 150 may have the stacked structure, such that multiple reflection may be performed. The first electrode layer 130 disposed above the first passivation layer 150 may include a metal, thereby improving reflection efficiency of light emitted from the active layer 122. Furthermore, since the first passivation layer 150 having the DBR structure and the first electrode layer 130 including a reflective metal are disposed at a front surface of the substrate 110 corresponding to the separated region between the light emitting cells 120, total reflection may be performed at an entire region of the light emitting device including a light emitting cell region for performing an actual luminescence and the separated region between the cells 120. Therefore, luminance efficiency may be improved.

Figure 6:
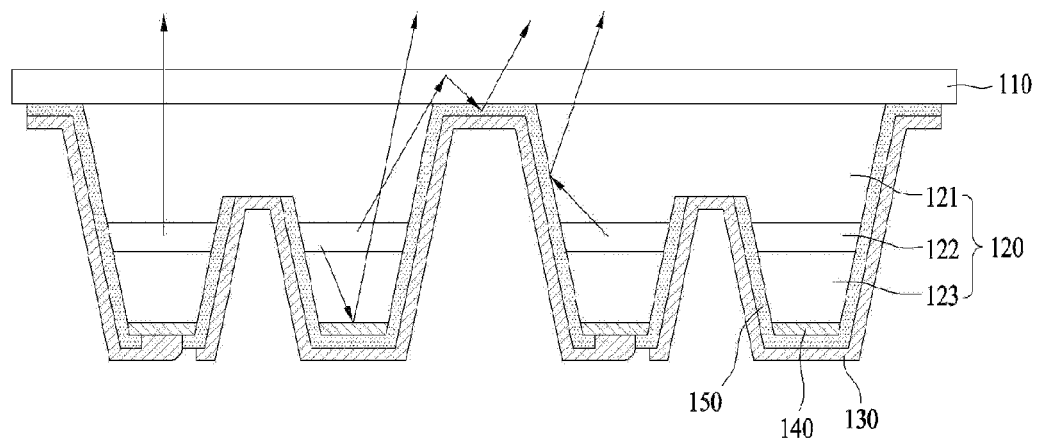
FIG. 6 is a view illustrating phenomenon of radiation of a light emitting device according to an embodiment.

FIG. 6 is a view illustrating phenomenon of radiation of a light emitting device according to an embodiment. In the light emitting device according to the embodiment, since the first passivation layer and the first electrode layer are also disposed at the substrate corresponding to the separated region between the different light emitting cells, namely, at the substrate in which the light emitting cell is not disposed, reflection and refraction of light may occur at the front surface of the substrate. Therefore, luminance efficiency may be improved in comparison with the conventional structure.

Figure 7A:
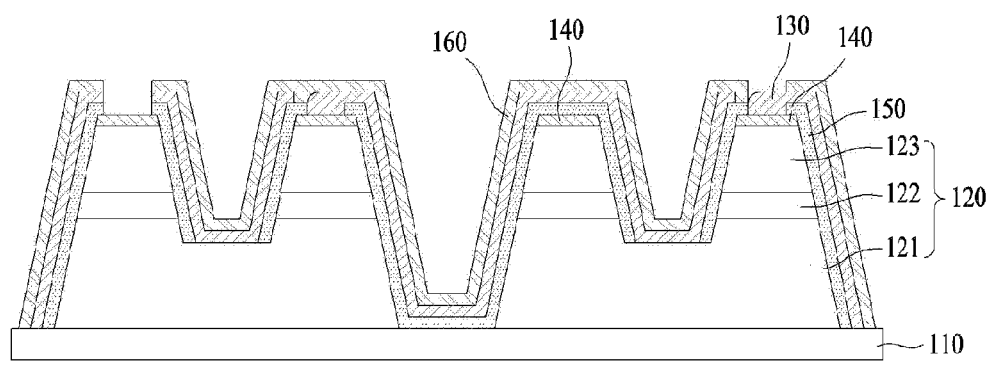
FIGS. 7A and 7B are views illustrating a light emitting device including a second passivation layer.
Figure 7B:
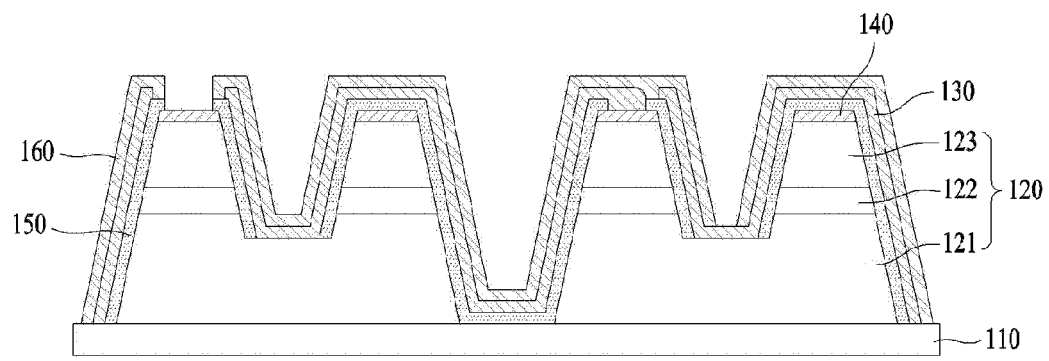

In another embodiment illustrated in FIGS. 7A and 7B, a second passivation layer 160 may be further provided. As illustrated in FIG. 7A, the second passivation layer 160 may be disposed on the first electrode layer 130 formed in the above-described embodiments. The second passivation layer 160 may be disposed on the entire light emitting device including the surfaces of the light emitting cells 120. In FIG. 7A, an upper part of the second electrode layer of a left light emitting cell may be opened to expose the second electrode layer and may be connected to an external electrode, as will be described below.

Furthermore, as illustrated in FIG. 7B, in at least one light emitting cell among a plurality of light emitting cells disposed on the substrate, regions exposing the first electrode layer and the second electrode layer may be formed. The exposed first and second electrode layers may be electrically connected to external electrodes. The second passivation layer 160 may be non-conductive. In detail, the second passivation layer 160 may include a non-conductive oxide, a non-conductive nitride, or an organic layer. In particular, the second passivation layer 160 may be formed of a material having at least one of Si, N, Ti, and O.

Each layer in the light emitting device according to the illustrated embodiments may be formed using a metal organic chemical vapor deposition (MOCVD), a chemical vapor deposition (CVD), a plasma-enhanced chemical vapor deposition (PECVD), a molecular beam epitaxy (MBE), or a hydride vapor phase epitaxy (HVPE), without being limited thereto.

FIGS. 8A to 8F are views illustrating a method of manufacturing a light emitting device according to an embodiment.

Figure 8A:
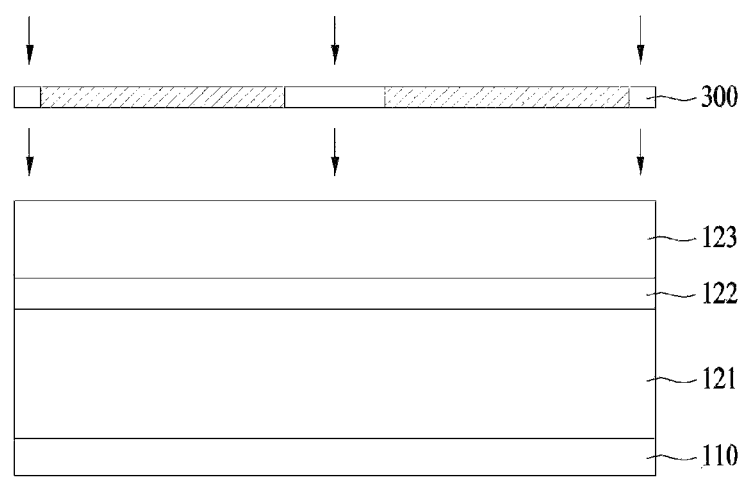
FIGS. 8A to 8F are views illustrating a method of manufacturing a light emitting device according to an embodiment.

In FIG. 8A, the first conductive type semiconductor layer 121, the active layer 122, and the second conductive type semiconductor layer 123 are sequentially grown on the substrate 110 to form a light emitting cell layer. A mask 300 is disposed on the light emitting cell layer.

Figure 8B:
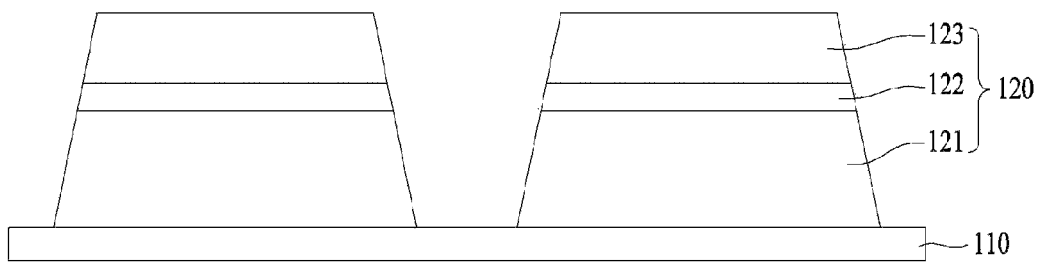

In FIG. 8B, the light emitting cell layer including the first conductive type semiconductor layer 121, the active layer 122, and the second conductive type semiconductor layer 123 are etched to correspond to a pattern of the disposed mask 300 so as to be partially removed from the substrate to thus form a plurality of light emitting cells 120 which are separated from one another.

Figure 8C:
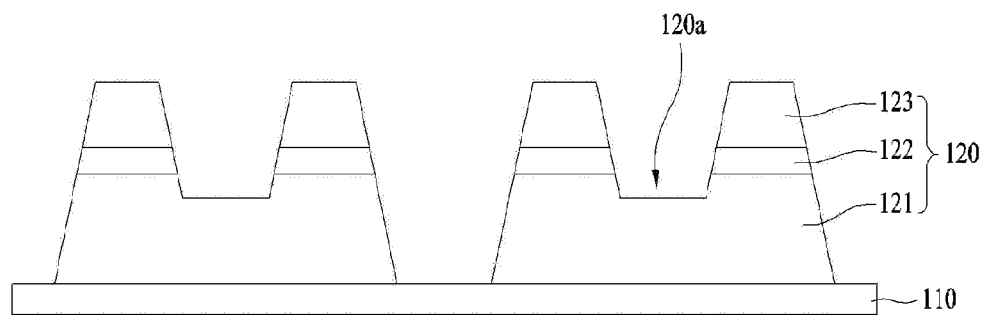

In FIG. 8C, at least one via holes 120a is formed through a certain etching process. Each via hole 120a passes through the second conductive type semiconductor layer 123 and the active layer 122 and exposes the part of the first conductive type semiconductor layer 121.

The process of FIGS. 8A to 8C is not limited to the above-description. For the sake of processing convenience, the process may be varied. Namely, after the second conductive type semiconductor layer 123 and the active layer 122 is partially removed and the via hole 120a is formed to expose the part of the first conductive type semiconductor layer 121, in order to form a plurality of light emitting cells 120, the light emitting cell layer including the first conductive type semiconductor layer 121, the active layer 122, and the second conductive type semiconductor layer 123 is exposed while the light emitting layer is removed to expose a certain region of the substrate 110.

Figure 8D:
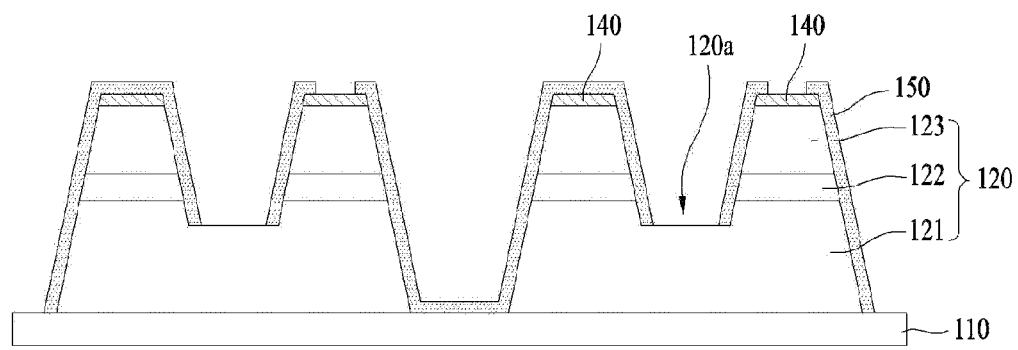

In FIG. 8D, the second electrode layer 140 is disposed on the second conductive type semiconductor layer 123 of the light emitting cell. The first passivation layer 150 is formed on the entire region including a plurality of light emitting cells 120 and the substrate 110 between adjacent light emitting cells 120. The formed first passivation layer 150 is disposed to open the first conductive type semiconductor layer 121 of the bottom surface of the via hole structure and the part of the second electrode layer 140.

Figure 8E:
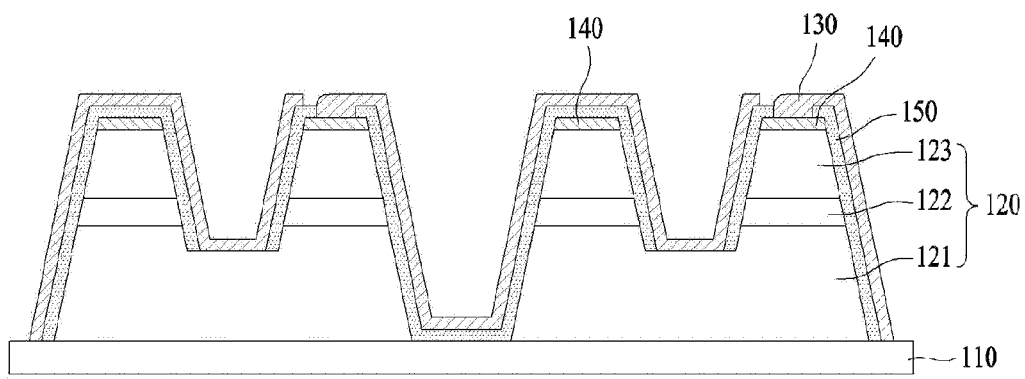

In FIG. 8E, the first electrode layer 130 is formed at the front surfaces of the light emitting cells 120 including the upper part of the first passivation layer 150 and the parts of the first conductive type semiconductor layer 121 and the second electrode 140 opened by the etching process. Herein, the first electrode layer is partially opened in order to electrically short the first electrode layer 130 and the second electrode layer 140 in one light emitting cell.

Figure 8F:
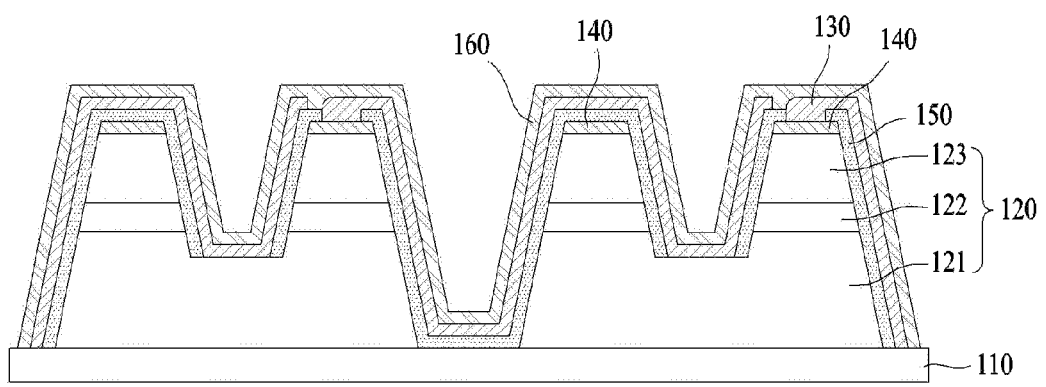

In FIG. 8F, the second passivation layer 160 is entirely formed at the upper part of the first electrode layer 130 and the region of the first electrode layer 130 having the shorted part. The formed second passivation layer 160 exposes at least one of first and second electrode layers 130 and 140 so as to connect the external electrode in the light emitting device.

Figure 9:
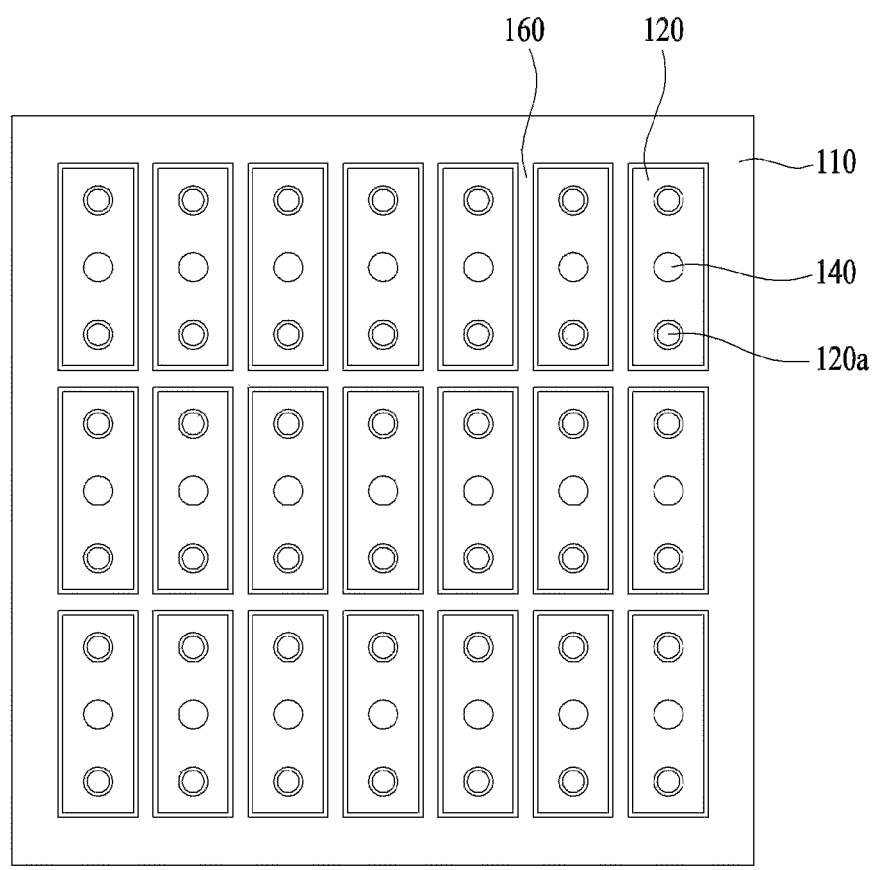
FIG. 9 is a plan view schematically illustrating a layout of a light emitting device.

FIG. 9 is a view schematically illustrating a layout of the light emitting device, at which the light emitting cells are disposed, in the case where the light emitting cells are formed by the manufacturing method of FIGS. 8A to 8F.

The layout illustrated in FIG. 9 is a part of a plurality of layers formed by the method of manufacturing the light emitting device according to the embodiment of FIGS. 8A to 8F.

In FIG. 9, the light emitting cells 120 are disposed on the substrate 110 to be spaced apart from one another. The second passivation layer 160 may be formed on the separated light emitting cells 120. The second passivation 160 may be formed on the entire front surface of the light emitting device including the upper part of the light emitting cell 120 except for the region where at least one of the first and second electrode layers is electrically connected to the external electrode.

The region indicated by the second passivation layer 160 may be a region for separation of adjacent light emitting cells 120. The first passivation layer (not shown) may be further provided below the second passivation layer 160.

As described above, the first passivation layer, the first electrode layer, and the second passivation layer 160 are stacked at a region separating the light emitting cells 120, and thus electrical short between the light emitting cells 120 may be prevented and luminance efficiency of the light emitting device may be improved since reflection and refraction of light occur at the separating region.

The first electrode layer (not shown) may be in electrical contact with the first conductive type semiconductor layer (not shown) through the via hole 120a illustrated in FIG. 9.

Furthermore, the first electrode layer (not shown) may be in electrical contact with the second electrode layer 140 of the adjacent light emitting cell. The second electrode layer 140 may be electrically connected to the second conductive type semiconductor layer (not shown).

Figure 10:
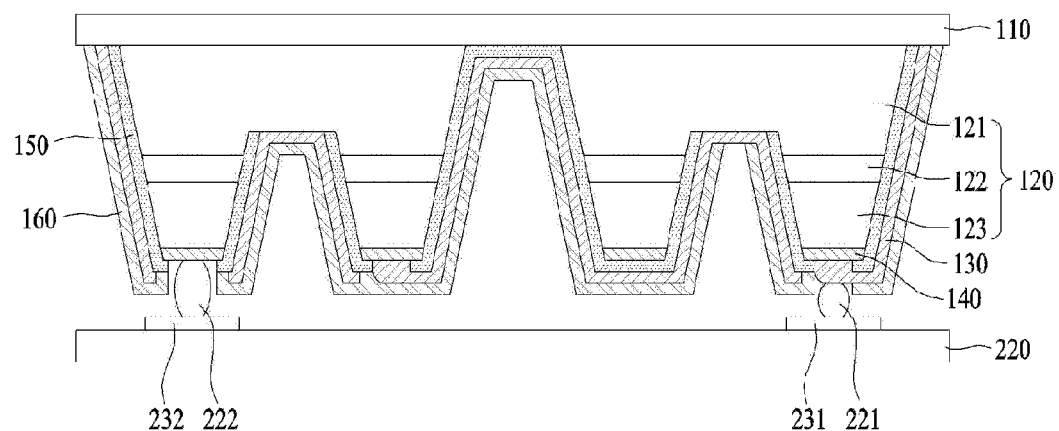
FIG. 10 is a view illustrating a flip-chip package of a light emitting device according to an embodiment.

FIG. 10 is a view illustrating a light emitting device package including the light emitting device according to an embodiment.

The light emitting device package according to the illustrated embodiment includes a submount 220 and first and second bumps 221 and 222 disposed between the one of the light emitting devices and the submount 220 to bond the first and second electrode layers to the submount 220 in a flip-chip manner.

In the illustrated embodiment, a first metallic layer 231 and a second metallic layer 232 may be further disposed on the submount 220 in order to electrically connect the submount 220 to the light emitting device. The bumps used when bonding the light emitting device in a flip-chip manner may include a first bump 221 and a second bump 222. The first bump 221 and the second bump 222 may be solders each having a ball shape. The first and second bumps 221 and 222 may be formed of a conductive material, and more particularly, of a metal. The first bump 221 and the second bump 222 are disposed on the first metallic layer 231 and the second metallic layer 232 of the submount 220, respectively, to be in electric contact with electrodes of the light emitting device.

The light emitting device illustrated in FIG. 10 is an example to apply the flip-chip type light emitting device to one embodiment. However, the embodiment is not limited thereto. The flip-chip type light emitting device may be applied to the other embodiments.

The light emitting device is mounted on the submount 220. The submount 220 may include a package body or a printed circuit board. The light emitting device may have variable shapes capable of being bonded in a flip-chip manner.

The light emitting device is disposed on the submount 220 and is electrically connected to the submount 220 through the first bump 221 and the second bump 222. The submount 220 may include a resin, such as a polyphtal amide (PPA), a liquid crystal polymer (LCP), a polyamide9T (PA9T), or a metal, a photo sensitive glass, a sapphire, a ceramic, or a printed circuit board. However, the submount 220 according to the illustrated embodiment is not limited to the above materials.

The first metallic layer 231 and the second metallic layer 232 are disposed on the submount 220 to be spaced apart from each other in a horizontal direction. Herein, an upper surface of the submount 220 may be a surface opposite the light emitting device. The first metallic layer 231 and the second metallic layer 232 may include a conductive metal, such as aluminum (Al) or rhodium (Rh).

The first bump 221 and the second bump 222 are disposed between the submount 220 and the light emitting device. The first bump 221 may electrically connect the first electrode layer 130 to the first metallic layer 231. The second bump 222 may electrically connect the second electrode layer 140 to the second metallic layer 232.

The first bump 221 and the second bump 222 may use at least one of Pb, Sn, Au, Ge, Cu, Bi, Cd, Zn, Ag, Ni, and Ti and an alloy thereof.

According to another embodiment, the light emitting device or the light emitting device package described above may be implemented as a display device, an indicator apparatus, and a lighting system. The lighting system may include, for example, a lamp or a street lamp.

Hereinafter, a display device and a lighting device as examples of the lighting system, in which the light emitting device package described above is disposed, will be explained.

Figure 11:
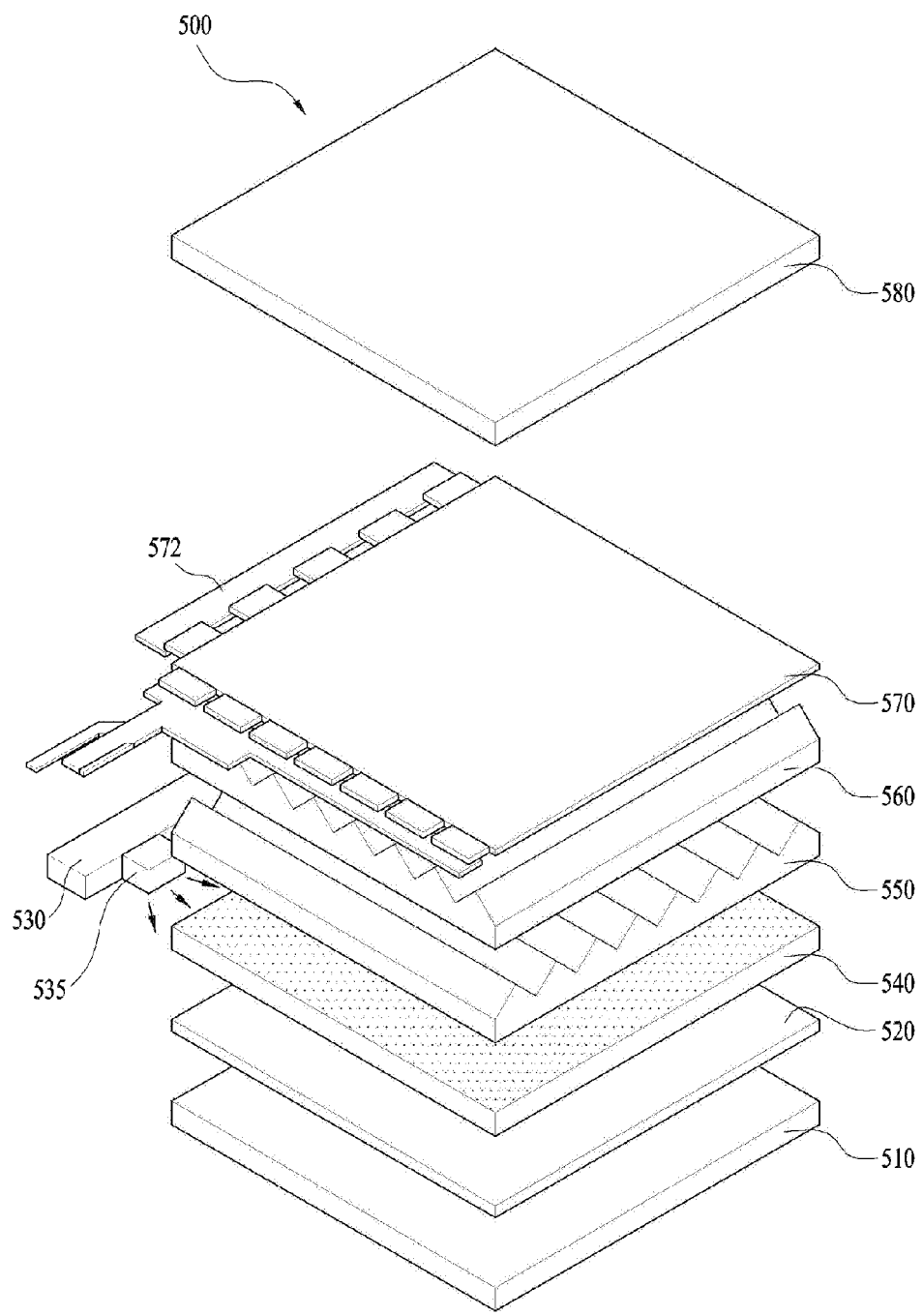
FIG. 11 is a view illustrating a backlight unit including a light emitting device according to an embodiment.

FIG. 11 is a view illustrating a display device including the light emitting device package according to an embodiment.

As illustrated, the display device 500 includes a light source module, a reflective plate 520 on a bottom cover 510, a light guide plate 540 disposed in front of the reflective plate 520 while guiding light emitted from the light source module to a front of the display device, a first prism sheet 550 and a second prism sheet 560 disposed in front of the light guide plate 540, a panel 570 disposed in front of the second prism sheet 560, and a color filter 580 disposed in front of the panel 570.

The light source module includes a light emitting package 535 on a circuit substrate 530. Herein, the circuit substrate 530 may use a PCB. When a light emitting device disposed in the light emitting device package 535 may apply the above-described embodiments, absorption of light within the light emitting device may be reduced, reflectance may be increased, and luminance may occur throughout a broader area since light is reflected from the entire light emitting device including a plurality of light emitting cells and separation regions between the light emitting cells. Thereby, luminance efficiency of the light source module of the display device may be improved.

The bottom cover 510 may accommodate components of the display device. The reflective plate 520 may be provided as a separate component as illustrated. Alternatively, a material having high reflectance may be coated at a rear surface of the light guide plate 540 or a front surface of the bottom cover 510 to form the reflective plate 520.

The reflective plate 520 may use a material having a high reflectivity and being capable of being thinly applied. The reflective plate 520 may use polyethylene terephtalate (PET).

The light guide plate 540 diffuses light emitted from the light source module to uniformly distribute light throughout the entire region of a screen of a liquid display device. Thus, the light guide plate 530 may include a material having a high refractive index and high transmittance. The light guide plate 530 may be formed of polymethylmethacrylate (PMMA), polycarbonate (PC) or polyethylene (PE). Furthermore, when the light guide plate 540 is omitted, an air-guide-type display device may be provided.

The first prism sheet 550 is formed on one side of a support film. The first prism sheet 550 is formed of a polymer material having transmittance and elasticity. The polymer may have a prism layer formed of a plurality of three-dimensional patterns, which are repeated. Herein, the plurality of patterns may have a stripe type, in which peaks and valley are repeated, as illustrated.

The second prism sheet 560 may be formed on one side of a support film. The second prism sheet 560 may have peaks and valley arranged in one direction, which is perpendicular to an arrangement direction of the peaks and valley of the first prism sheet 550. Thus, light transferred from the light source module and the reflective plate 520 may be uniformly dispersed in all directions of the panel 570.

In the illustrated embodiment, the first prism sheet 550 and the second prism sheet 560 constitute an optical sheet. In other combination examples, the optical sheet may include a micro lens array, a diffuser sheet and a micro lens array, or one prism sheet and a micro lens array.

The panel 570 may be a liquid crystal panel. Instead of the liquid crystal panel, other display devices requiring a light source may be provided.

In the panel 570, a liquid crystal is interposed between glass bodies and polarization plates are disposed on both glass bodies to use polarity of light. Herein, the liquid crystal has characteristics intermediate to those a liquid and a solid. A liquid crystal is organic molecules having fluidity, like a liquid, and is uniformly arranged, like a crystal. An image is displayed by changing the molecular arrangement using external electrical field.

The liquid display panel used at the display device is provided in an active matrix manner. A transistor is used as a switch for controlling voltage supplied to each pixel.

The color filter 580 is disposed at the front surface of the panel 570, such that the image may be displayed through the emission of red, green and blue from respective pixels of the panel 570.

Figure 12:
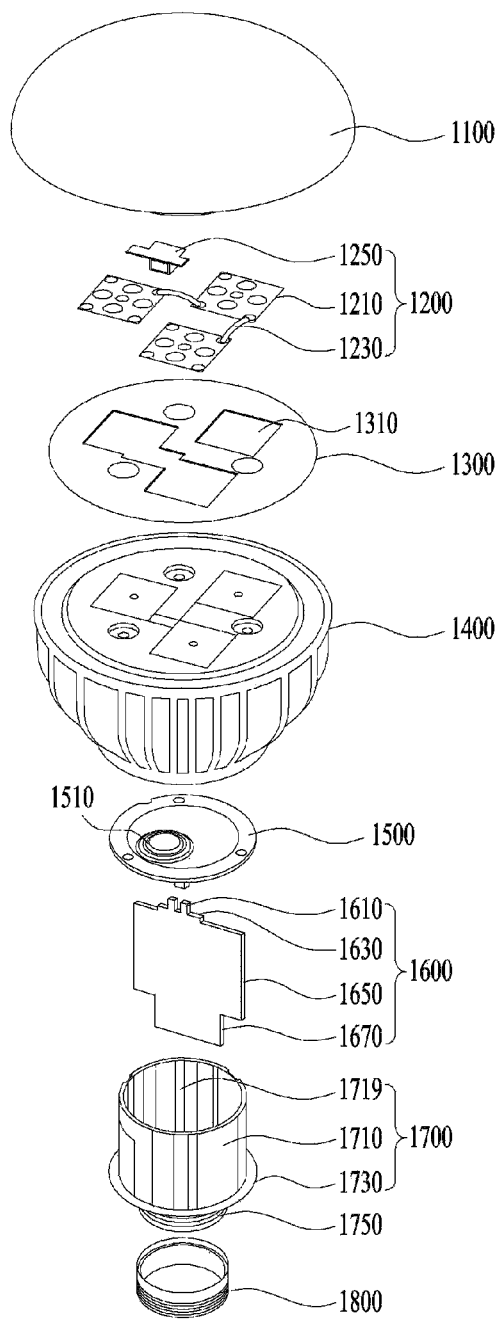
FIG. 12 is a view illustrating a lighting apparatus including a light emitting device according to an embodiment.

FIG. 12 is a view illustrating a lighting apparatus including the light emitting device according to an embodiment The lighting apparatus according to the illustrated embodiment may include a cover 1100, a light source module 1200, a radiator 1400, a power supply 1600, an inner case 1700, and a socket 1800. In addition, the lighting apparatus may further include at least one of an element 1300 and a holder 1500. The light source module 1200 includes a light emitting device package according to the above-described embodiments. In detail, there are the passivation having the stacked structure including the reflection layer and the first electrode having the metallic material at a plurality of light emitting cell regions and separation regions between the light emitting cells in the light emitting device. Accordingly, reflectivity may be improved and thus brightness is improved. In addition, radiation of heat may be improved by the flip-chip structure.

The cover 1100 may have a bulbous or hemisphere shape, may be hollow, and may be provided to have an opened part. The cover 1100 may be optically coupled to the light source module 1200. For example, the cover 1100 may diffuse, scatter, and excite light supplied from the light source module 1200. The cover 1100 may be a kind of optical element. The cover 1100 may be coupled to the radiator 1400. The cover 1100 may include a coupling part to be coupled to the radiator 1400.

Ivory white paint may be coated on an inner surface of the cover 1100. The ivory white paint may include a diffusion material for diffusing light. Roughness of the inner surface of the cover 1100 may be greater than roughness of an outer surface of the cover 1100. Thus, light from the light source module 1200 may be sufficiently scattered and diffused so as to be emitted outside.

The cover 1100 may be formed of a glass, a plastic, a polypropylene (PP), a polyethylene (PE), and a polycarbonate (PC). Herein, among these, the polycarbonate has high light resistance, heat resistance, and strength. The cover 1100 may be transparent, such that the light source module 1200 may be visible from outside. Alternatively, the cover 1100 may be opaque. The cover 1100 may be formed by blow molding.

The light source module 1200 may be disposed at one side of the radiator 1400. Accordingly, heat from the light source module 1200 is transmitted to the radiator 1400. The light source module 1200 may include a light emitting device package 1210, a connection plate 1230, and a connector 1250.

The element 1300 is disposed on the radiator 1400 and includes guide grooves 1310 where the light emitting device packages 1210 and the connector 1250 are inserted. The guide grooves 1310 correspond to a substrate of each light emitting device package 1210 and the connector 1250.

A surface of the element 1300 may be deposited or coated with a light reflective material. For example, the surface of the element 1300 may have white paint deposited or coated thereon. The element 1300 reflects light, which is reflected from the inner surface of the cover 1100 to the light source module 1200, to the cover 1100. Thus, luminance efficiency of the lighting apparatus may be improved.

The element 1300 may be formed of, for example, an insulating material. The connection plate 1230 of the light source module 1200 may include an electroconductive material. Accordingly, electrical contact between the radiator 1400 and the connection plate 1230 may be achieved. Since the element 1300 is formed of the insulating material, electric short between the connection plate 1230 and the radiator 1400 may be prevented. The radiator 1400 receives heat from the light source module 1200 and from the power supply 1600 so as to radiate heat.

The holder 1500 closes an accommodating groove 1719 of an insulator 1710 of the inner case 1700. Thus, the power supply 1600 accommodated in the insulator 1710 of the inner case 1700 is encapsulated. The holder 1500 includes a guide protrusion 1510. The guide protrusion 1510 includes a hole, through which a protrusion 1610 of the power supply 1600 passes.

The power supply 1600 processes or coverts an electric signal supplied from outside to supply power to the light source module 1200. The power supply 1600 is accommodated in the accommodating groove 1719 of the inner case 1700 and is encapsulated in the inner case 1700 by the holder 1500. The power supply 1600 may include the protrusion 1610, a guide part 1630, a base 1650, and an extension 1670.

The guide part 1630 may protrude outside from one side of the base 1650. The guide part 1630 may be inserted into the holder 1500. A plurality of components may be disposed on one side of the base 1650. For example, the components may include a DC converter for converting alternating current supplied from an external power supply to direct current, a driving chip for controlling the operation of the light source module 1200, and an electrostatic discharge (ESD) protection device for protecting the light source module 1200, without being limited thereto.

The extension 1670 protrudes outside from another side of the base 1650. The extension 1670 is inserted into the connector 1750 of the inner case 1700 and receives an electrical signal from outside. For example, the extension 1670 may be provided to have a width equal to or less than a width of the connector 1750 of the inner case 1700. The extension 1670 may be electrically connected to one end of a "+wire" and one end of a "−wire". The other end of the "+wire" and the other end of the "−wire" may be electrically connected to the socket 1800.

The inner case 1700 may include a molding part as well as the power supply 1600 therein. The molding part is a part where a molding liquid is hardened. The power supply 1600 may be fixed in the inner case 1700 by the molding part.

Although exemplary embodiments of the present disclosure have been described for illustrative purposes, those skilled in the art will appreciate that various modifications, additions and substitutions are possible, without departing from the scope and spirit of the disclosure. Therefore, exemplary embodiments of the present disclosure have not been described for limiting purposes. Accordingly, the scope of the disclosure is not to be limited by the above embodiments but by the claims and the equivalents thereof.

MODE FOR INVENTION

Various embodiments have been described in the best mode for carrying out the invention.

INDUSTRIAL APPLICABILITY

The above-described light emitting package may be applied to various fields. For example, the light emitting package may be applied to a lighting apparatus. For example, the light apparatus may include at least one of a backlight unit, a lighting unit, an indicator device, a lamp or a streetlamp.

The invention claimed is:
1. A light emitting device comprising:
a substrate;
a plurality of Light emitting structures disposed on the substrate, each light emitting structure comprising a first conductive type semiconductor layer, an active layer, and a second conductive type semiconductor layer, the light emitting structure having a recess passing through the second conductive type semiconductor layer, the active layer and a part of the first conductive type semiconductor layer;
a first electrode layer electrically connected to the first conductive type semiconductor layer at a bottom of an inside of the recess;
a second electrode layer electrically connected the second conductive type semiconductor layer;

a first passivation layer disposed from an upper surface of the first conductive type semiconductor layer to the inside of the recess; and a second passivation layer disposed on the first electrode layer, wherein the first passivation layer includes a first portion and a second portion each provided on an upper surface of the second conductive type semiconductor layer, the first portion is provided around an opening of the recess, has a curved edge, and covers the recess, and the second portion has a non-curved edge.

2. The light emitting device according to claim 1, wherein each of the light emitting structures has a plurality of recesses including the recess, and the first passivation layer is disposed across the light emitting structures and connects the plurality of recesses.

3. The light emitting device according to claim 2, wherein the first passivation layer directly contacts the substrate between the adjacent light emitting structures.

4. The light emitting device according to claim 1, wherein the second passivation layer is disposed at entire regions surfaces of the light emitting structures, and the second passivation layer includes opened regions which expose at least one of the first electrode layers and the second electrode layers.

5. The light emitting device according to claim 4, wherein the second passivation layer includes at least one of Si, N, Ti and O.

6. The light emitting device according to claim 1, wherein each of the first electrode layers is an ohmic electrode including at least one of Al and Ag, and each of the second electrode layers includes a transparent electrode layer and a reflective layer.

7. The light emitting device according to claim 1, wherein the first passivation layer has a reflective layer structure, in which a plurality of layers is stacked.

8. The light emitting device according to claim 7, wherein the reflective layer structure including the stacked layers includes a distributed Bragg reflector.

9. A light emitting device comprising:
a substrate;
a plurality of light emitting, structures disposed on the substrate, each light emitting structure comprising a first conductive type semiconductor layer, an active layer, and a second conductive type semiconductor layer, the light emitting structure having a recess passing through the second conductive type semiconductor layer, the active layer and a part of the first conductive type semiconductor layer;
a first electrode layer electrically connected to the first conductive type semiconductor layer at a bottom of an inside of the recess;
a second electrode layer electrically connected to the second conductive type semiconductor layer;
a first passivation layer disposed from an upper surface of the first conductive type semiconductor layer to the inside of the recess; and
a second passivation layer arranged above the first electrode layer, wherein a width of the first passivation layer at a first region around the recess is wider than a width of the first passivation layer at a second region, the second region partially provided around the first electrode, and wherein an interface of the first passivation layer with the second conductive type semiconductor layer at a region adjacent to the recess has a curve.

10. The light emitting device according to claim 9, wherein the first passivation layer is disposed between the second electrode layer, a sidewall of the recess, and a sidewall of the light emitting structure.

11. The light emitting device according to claim 10, wherein the first passivation layer is further disposed at the substrate between adjacent light emitting structures.

12. The light emitting device according to claim 9, wherein the second passivation layer is disposed at entire regions of surfaces of the light emitting structures, and
the second passivation layer includes opened regions which expose at least one of the first electrode layers and the second electrode layers.

13. The light emitting device according to claim 12, wherein the second passivation layer includes at least one of Si, N, Ti and O.

14. The light emitting device according to claim 9, wherein each of the first electrode layers is an ohmic electrode including at least one of Al and Ag, and each of the second electrode layers includes a transparent electrode layer and a reflective layer.

15. The light emitting device according to claim 9, wherein the first passivation layer has a reflective layer structure, in which a plurality of layers is stacked.

16. A light emitting device comprising:
a substrate;
a plurality of light emitting structures disposed on the substrate, each light emitting structure comprising a first conductive type semiconductor layer, an active layer, and a second conductive type semiconductor layer, the light emitting structure having a recess passing through the second conductive type semiconductor layer, the active layer and a part of the first conductive type semiconductor layer;
a first electrode layer electrically connected to the first conductive type semiconductor layer at a bottom of an inside of the recess;
a second electrode layer electrically connected to the second conductive type semiconductor layer; and
a first passivation layer electrically separating the first electrode layer from the second electrode layer,
wherein the first passivation layer includes a first portion and a second portion each disposed on an upper surface of the second conductive type semiconductor layer, the first is portion is provided around an opening of the recess and has a curved edge and covering the recess, and the second portion has a non-curved edge,
wherein a plurality of the recesses is provided in each of the light emitting structure, and the first passivation layer is disposed across the light emitting structures and connects the plurality of the recesses.

* * * * *